United States Patent
Satoh et al.

(10) Patent No.: US 6,621,154 B1
(45) Date of Patent: Sep. 16, 2003

(54) SEMICONDUCTOR APPARATUS HAVING STRESS CUSHIONING LAYER

(75) Inventors: Toshiya Satoh, Kanasagou-machi (JP); Masahiko Ogino, Hitachi (JP); Tadanori Segawa, Hitachi (JP); Takao Miwa, Hitachinaka (JP); Akira Nagai, Hitachi (JP); Akihiro Yaguchi, Iwama-machi (JP); Ichiro Anjo, Koganei (JP); Asao Nishimura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/671,364

(22) Filed: Sep. 28, 2000

(30) Foreign Application Priority Data

Feb. 18, 2000 (JP) .......................................... 2000-046817

(51) Int. Cl.⁷ .......................... H01L 23/29; H01L 23/31; H01L 23/12; C08L 13/00; C08L 63/00
(52) U.S. Cl. .................... 257/684; 257/644; 257/737; 257/732; 257/796; 257/787; 257/789; 257/788; 257/795; 257/700; 257/701; 257/783; 257/751; 257/758; 257/40; 257/786
(58) Field of Search .................. 257/40, 684, 737, 257/738, 758, 700, 701, 751, 431, 789, 783, 782, 788, 795, 786

(56) References Cited

U.S. PATENT DOCUMENTS

| | | | |
|---|---|---|---|
| 4,127,738 A | * 11/1978 | Ghosh et al. | 136/89 |
| 5,148,265 A | 9/1992 | Khandros et al. | |
| 5,935,452 A | * 8/1999 | Inada et al. | 216/20 |
| 6,090,468 A | * 7/2000 | Shimada et al. | 361/761 |
| 6,132,585 A | * 10/2000 | Midorikawa et al. | 257/52 |
| 6,181,569 B1 | * 1/2001 | Chakravorty | 257/737 |
| 6,265,782 B1 | * 7/2001 | Yamamoto et al. | 257/783 |
| 6,274,821 B1 | * 8/2001 | Echigo et al. | 257/702 |
| 6,291,763 B1 | * 9/2001 | Nakamura | 257/431 |
| 6,333,206 B1 | * 12/2001 | Ito et al. | 257/686 |
| 2001/0033031 A1 | * 10/2001 | Shibata | 257/777 |

FOREIGN PATENT DOCUMENTS

| | | | |
|---|---|---|---|
| JP | 63-166261 | * 7/1988 | 257/40 |
| JP | 9232256 | 9/1997 | |
| JP | 1027827 | 1/1998 | |
| JP | 2001-107001 | * 10/1999 | |
| JP | 2001-230341 | * 2/2000 | |
| JP | 2001-123013 | * 5/2001 | |

OTHER PUBLICATIONS

"Nikkei Microdevice" (p. 38 to p. 64) Issued by Nikkei BP, Ltd. (Feb. 1998).

* cited by examiner

Primary Examiner—Alexander O. Williams
(74) Attorney, Agent, or Firm—Antonelli, Terry, Stout & Kraus, LLP

(57) ABSTRACT

A miniature semiconductor apparatus is outstanding in reflow resistance, temperature cycle property, and PCT resistance corresponding to high density packing, high densification, and speeding up of processing. The semiconductor apparatus has at least one stress cushioning layer on a semiconductor element with an electrode pad formed, having a conductor on the stress cushioning layer, having a conductor for conducting the electrode pad and conductor via a through hole passing through the stress cushioning layer between the electrode pad and the conductor, having an external electrode on the conductor, and having a stress cushioning layer in an area other than the area where the external electrode exists and a conductor protection layer on the conductor, wherein the stress cushioning layer includes crosslinking acrylonitrile-butadiene rubber having an epoxy resin which is solid at 25° C. and a carboxyl group.

29 Claims, 2 Drawing Sheets

SEMICONDUCTOR APPARATUS HAVING STRESS CUSHIONING LAYER

BACKGROUND OF THE INVENTION

The present invention relates to a semiconductor apparatus having a chip size package used for a high density assembly module or a multi-chip module.

Recently, in association with wide spread of portable information terminal units and miniaturization and high performance of electronic devices, high density packing, high densification, and speeding up of processing are also required for a semiconductor device. In correspondence with it, as a semiconductor apparatus mounting method, a multi-pin corresponding type package such as from the pin insertion type to the surface mounting type and from a DIP (dual inline package) to a QFP (quad flat package) or PGA (pin grid array) has been developed.

However, in the QFP type, the connection lead wires with the mounting substrate are centralized in the peripheral part of the package and moreover the lead wires themselves are thin and deformable, so that as the number of pins increases, the mounting reliability reduces. In the PGA type, the terminals to be connected to the mounting substrate are long and thin and centralized extremely, so that speeding up is difficult on an electric characteristic basis.

To realize a semiconductor apparatus in correspondence with high speed, a package of a BGA (ball grid array) type having a stress cushioning material between the semiconductor element and the substrate with a wiring circuit formed and a bump electrode which is an external terminal on the mounting substrate surface side of the substrate with a wiring circuit formed has been proposed (U.S. Pat. No. 5,148,265).

In this package, surface mounting is available that the terminals for connecting with the mounting substrate are ball-shaped solder, and the lead wires are free of deformation such as generated in the QFP type, and the terminals can be dispersed overall the package surface, and the pitch between the terminals can be made longer. As compared with the PGA type, the bump electrode which is an external terminal is short in length, so that the inductance component is small and the signal transmission can be speeded up.

A CSP (chip scale package) having a size almost equal to that of the chip is disclosed in "Nikkei Microdevice" issued by Nikkei BP, Ltd. (February 1998) (p. 38 to p. 64). In the CSP, on the polyimide or ceramics substrate with a wiring layer formed, semiconductor elements cut into pieces are adhered, and then the wiring layer and the semiconductor elements are electrically connected by wire bonding, single point bonding, gang bonding, or bump bonding, and the connections are sealed by resin, and then an external terminal such as a solder bump is formed.

Japanese Patent Application Laid-Open 9-232256 and Japanese Patent Application Laid-Open 10-27827 disclose methods for mass-producing CSPs. The methods form a bump on a semiconductor wafer, electrically connect a wiring substrate via the bump, then seal the connections with resin, form an external electrode on the wiring substrate, finally cut it into pieces, and manufacture a semiconductor apparatus. In "Nikkei Microdevice" (p. 164 to 167) issued by Nikkei BP, Ltd. (April 1998), a bump is formed by plating on a semiconductor wafer and the part other than the bump is sealed by resin. Furthermore, an external electrode is formed in the bump part, and finally it is cut into pieces, and a semiconductor apparatus is manufactured.

SUMMARY OF THE INVENTION

In the CSP which is assembled by adhering the semiconductor elements cut into pieces to the aforementioned polyimide or ceramics substrate, when the wiring layer and chip are connected by wire bonding, since the bonding area of the wiring layer is positioned outside the bonding area, the package size is necessarily larger than the chip size. When they are connected by bump bonding, to prevent resin from dropping when the chip and substrate are sealed by bonding resin, the chip is larger than the substrate. Namely, a problem arises that the size of the CSP is larger than the chip size.

In the aforementioned CSP using chips cut into pieces, since the chips are diced and then each chip is positioned and adhered on the substrate, electrically connected, and sealed with resin, a problem arises that it requires a lot of time to manufacture a semiconductor apparatus.

In a CSP using a resin substrate such as polyimide or glass epoxy, the chips are adhered via an adhesive, so that a problem arises that at the time of reflow when the package is mounted on the mounting substrate, absorbed moisture is expanded inside the package and a fault such as foaming or peeling is caused.

In a CSP that a bump is formed on a semiconductor wafer, and the wafer is connected to the substrate, and resin is sealed between the substrate and the semiconductor wafer, and an external electrode is formed, and then the wafer is cut into pieces, a resin layer is formed only on one side of the wafer, so that a problem arises that the semiconductor wafer and semiconductor apparatus are warped due to cure shrinkage of the resin.

The present invention, with the foregoing in view, provides a miniature semiconductor apparatus for corresponding to high density packing, high densification, and speeding up of processing which is outstanding in mounting reliability and mass production.

The summary of the present invention for solving the aforementioned problems will be described hereunder.

(1) In a semiconductor apparatus having at least one stress cushioning layer on a semiconductor element with an electrode pad formed, having a conductor on the stress cushioning layer, having a conductor for conducting the electrode pad and conductor via a through hole passing through the stress cushioning layer between the electrode pad and the conductor, having an external electrode on the conductor, and having a stress cushioning layer in other than the area where the external electrode exists and a conductor protection layer on the conductor, the stress cushioning layer includes crosslinking acrylonitrile-butadiene rubber having an epoxy resin which is solid at 25° C. and a carboxyl group.

The end faces of the semiconductor element of the semiconductor apparatus and of the stress cushioning layer or conductor protection layer are exposed outside on the same surface and the stress cushioning layer is a film-shaped adhesive including 100 to 200 wt % of fine particles of crosslinking acrylonitride-butadiene series having an epoxy resin composition which is solid at 25° C. and a carboxyl group to 100 wt % of expoxy resin composition.

The aforementioned semiconductor apparatus is an apparatus that the end face of the stress cushioning layer or conductor protection layer is exposed outside on the inside of the end face of the semiconductor element.

(2) In a semiconductor apparatus having a semiconductor element protection layer on a semiconductor element with an electrode pad formed, having a first conductor on the semiconductor element protection layer, having a conductor for conducting the electrode pad and first conductor via a first through hole passing through the semiconductor element protection layer between the electrode pad and the first conductor, having a stress cushioning layer composed of a single or a plurality of layers on the semiconductor element protection layer and first conductor, having a second conductor on the stress cushioning layer, having a conductor for conducting the first conductor and second conductor via a second through hole passing through the stress cushioning layer between the first conductor and the second conductor, having an external electrode on the second conductor, having a stress cushioning layer in other than the area where the external electrode exists and a conductor protection layer on the second conductor, wherein the end faces of the semiconductor element, stress cushioning layer, and conductor protection layer are exposed outside on the same surface and the stress cushioning layer is a film-shaped adhesive including 100 to 200 wt % of crosslinking acrylonitride-butadiene rubber having an epoxy resin composition which is solid at 25° C. and a carboxyl group to 100 wt % of expoxy resin composition.

(3) In a semiconductor apparatus having a semiconductor element protection layer on a semiconductor element with an electrode pad formed, having a first conductor on the semiconductor element protection layer, having a conductor for conducting the electrode pad and first conductor via a first through hole passing through the semiconductor element protection layer between the electrode pad and the first conductor, having a stress cushioning layer composed of a single or a plurality of layers on the semiconductor element protection layer and first conductor, having a second conductor on the stress cushioning layer, having a conductor for conducting the first conductor and second conductor via a second through hole passing through the stress cushioning layer between the first conductor and the second conductor, having an external electrode on the second conductor, having a stress cushioning layer in other than the area where the external electrode exists and a conductor protection layer on the second conductor, wherein the end faces of the semiconductor protection layer, stress cushioning layer, and conductor protection layer are exposed outside on the inside of the end face of the semiconductor element and the stress cushioning layer is a film-shaped adhesive including 100 to 200 wt % of fine particles of crosslinking acrylonitride-butadiene rubber having an epoxy resin composition which is solid at 25° C. and a carboxyl group to 100 wt % of expoxy resin composition.

DETAILED DESCRIPTION OF THE INVENTION

Figure 1:
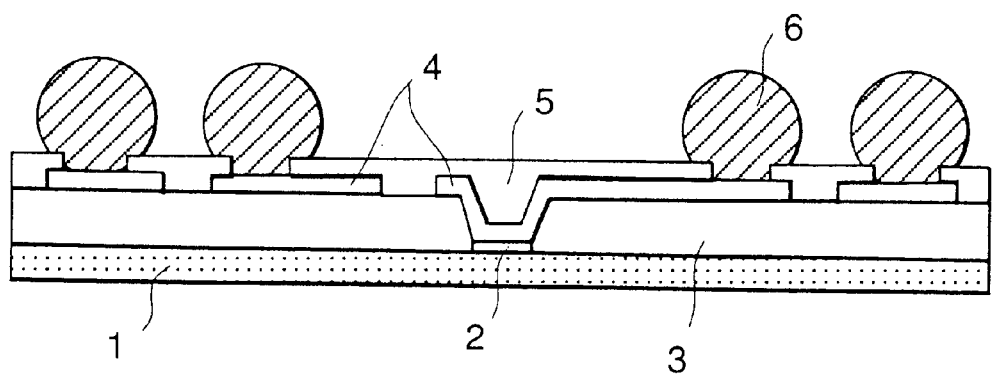
FIG. 1 is a cross sectional schematic view showing an example of a semiconductor apparatus of the present invention.

A plurality of semiconductor elements of the present invention are regularly formed on a silicone wafer in a predetermined size and on the surface of each of the semiconductor elements, a semiconductor integrated circuit of logic, memory, and gate array formed by a predetermined process and an electrode for sending and receiving electric signals to and from the outside of the semiconductor element are formed.

A semiconductor element protection layer formed on each semiconductor integrated circuit surface is not particularly limited as long as it can protect the semiconductor element from an external environment and polyimide, polyamide, polyamide-imide, epoxy resin, maleic-imide resin, phenolic resin, cyanate resin, silicone resin, fluorine plastics, and resin compositions containing them can be used. To these resin compositions, a rubber component such as acrylic rubber, silicone rubber, or nitrile butadiene rubber, an organic filler such as polyamide or polymide, or an inorganic filler such as silica may be added.

Furthermore, the semiconductor element protection layer may be formed by a photosensitive material including any of the aforementioned resin compositions.

It is desirable that the stress cushioning layer of the present invention is an adhesive composed of fine particles of crosslinking acrylonitride-butadiene rubber having an epoxy resin composition which is solid at 25° C. and a carboxyl group in its molecular structure.

When the aforementioned epoxy resin composition is an expoxy resin which is solid at 25° C., there is particularly no limit to it.

For example, one or a combination of a plurality of resins among the known epoxy resins such as bisphenol F, bisphenol A, bisphenol S, dihydroxy naphthalene, dimer acid, resorcinol, dicyclopentadiene phenol, dicyclopentadiene xylenol, terpene diphenol, diglycidylether such as biphenyl, epoxidized phenolic novolac, epoxidized cresol novolac, epoxidized trisphenyrol methane, epoxidized tetraphenyrol ethane, and epoxidized metaxylene diamine may be used.

To the aforementioned epoxy resin compositions, it is desirable to add a curing agent of epoxy resin. As a curing agent, known compounds may be selected as required. For example, one or a combination of a plurality of agents among the known curing agents such as novolac resin having a hydroxyl group such as phenolic novolac or cresol novolac, acid anhydride such as anhydrous pyromellitic acid or anhydrous benzophenone, or amine compound may be used. With respect to the loads of these agents, it is desirable that the equivalent of a curing agent per each active hydrogen for the epoxy equivalent per each epoxy group is a stoichiometry ratio.

Furthermore, a curing promotor can be added insofar as the effect of the present invention is not lost. For example, known curing agents such as boron trifluoride such as aromatic polyamine or boron trifluoride triethyl amine complex, imidazole derivative such as 2-alkyl-4-methyl imidazole or 2-pheny-4-alkyl imidazole, organic acid such as phthalic anhydride or anhydrous trimellitate, dicyandiamide, triphenylphosphine, and diazabicycloundecene can be used.

According to the present invention, with respect to fine particles of crosslinking acrylonitride-butadiene rubber having a carboxyl group in its molecular structure, the fine particle rubber may be surface-treated from the viewpoint of improvement of adhesion and compatibility.

It is desirable that the fine particle rubber is set to 100 to 200 wt % to 100 wt % of epoxy resin. When it is set to more than 200 wt %, the surface condition of the adhering member gets worse, and satisfactory adhesion cannot be obtained, and when there are uneven parts of the wiring on the adhesion surface, an adhesive composition cannot be filled in the gaps satisfactorily and generation of voids is caused. When it is set to less than 100 wt %, in the heat bonding process, flow of adhesive composition is generated.

The aforementioned adhesive used for the stress cushioning layer must be heated and cured after forming on the semiconductor element or semiconductor element protection layer. With respect to the heating and curing conditions, any conditions under which the physical properties after curing are stabilized are acceptable and for example, the adhesive may be heated at 120 to 200° C. for 10 minutes to 5 hours, preferably at 150 to 180° C. for 30 minutes to 1 hour.

Next, the adhesive manufacturing method of the present invention will be explained hereunder. Firstly, the aforementioned epoxy resin is dissolved by an organic solvent. As an organic solvent, if a solvent dissolves the epoxy resin composition uniformly, there is no particular limit to it. For example, there are dimethyl sulfoxide, N-methylpyrrolidone, N,N-dimethylformamid, N,N-dimethylacetoamide, tetrahydrofuran, diozane, monogrime, digrime, benzene, toluene, xylene, methyl ethyl ketone, methyl cellosolve, cellosolve acetate, butyl cellorolve acetate, cyclohexanone, butyrolactone, and 1-acetoxy-2-methoxyethane available and a mixed solvent of two or more kinds of them may be used. In this process, it is desirable to add and mix 0.001 to 10 wt % of coupling agent to 100 wt % of adhesive resin. When the addition amount of coupling agent is more than 10 wt %, the wetting property of adhesive gets worse and the adhesion force lowers the coupling agent.

As coupling agents, there are various silane series coupling agents such as γ-glycidoxypropyltrimethoxy silane, glycidoxypropylmethyldithoxy silane, epoxy silane such as β-(3,4-epoxycyclohexyl) ethyl trimethoxysilane, vinyltriethoxysilane, vinyltrimethoxysilane, vinylsilane such as γ-methacryloxymethoxy silane, γ-aminopropyl triethoxy silane, γ-aminopropyl trimethoxy silane, aminosilane such as N-phenyl-γ-aminopropyl trimethoxy silane, and mercaptosilane such as γ-mercaptopropyl triethoxy silane, titanium series coupling agents, and metal complex coupling agents such as alumikylate and zircoaluminate. Among them, a silane coupling agent is desirable and an epoxy silane series coupling agent is particularly desirable.

Then, to 100 wt % of epoxy resin of the aforementioned epoxy resin composition solution, 100 to 200 wt % of fine particles of crosslinking acrylonitride-butadiene rubber having a carboxyl group in its molecular structure are mixed and stirred and varnish of adhesive composition is prepared. For mixing and stirring fine particles of crosslinking acrylonitride-butadiene rubber having a carboxyl group in its molecular structure, a general fine particle mixing method using 3 rolls and a Henschel mixer can be used.

As long as the characteristics of adhesive are not lost, an inorganic component having no organic component such as an anti-oxidizing agent and an ion uptake agent, a filler such as resin particles, ceramics powder, glass powder, silver powder, or copper powder when necessary, other additives, an inorganic matter such as colloidal silica, fume silica, crystalline silica, molten silica, aluminum oxide, titanium oxide, and zirconium oxide, furthermore inorganic compound fine particles having a functional group such as a hydroxyl group, a methyl group, a methoxy group, an ethyl group, or an ethoxy group can be added.

In this case, colloidal silica is a colloidal solution of polymeric silicic anhydride. It is marketed as silica sol and generally moisture is a dispersion medium. However, organo silicasol using an organic solvent as a dispersion medium is also marketed. According to the present invention, from the viewpoint of solubility of resin, organo silicasol dispersed in an organic solvent is desirable. Fume silica is dry extremely fine silica marketed as aerosil and from the viewpoint of dispersion into resin or a solvent, aerosil modified by an organic group is desirable. The content is preferably within the range of 0 to 40 wt % to 100 wt % of resin composition and when it is more than 40 wt %, the coefficient of elasticity of adhesive after curing increases, and the stress reduction effect is small, and the adhesive strength is reduced.

According to the present invention, the aforementioned adhesive used for the stress cushioning layer may be processed as a film-shaped adhesive. As a film-shaped adhesive, there are a single layer that the adhesive itself is a film and a plurality of layers that an adhesive is formed both sides of another film.

A single layer film-shaped adhesive is manufactured, for example, as shown below. Firstly, varnish of adhesive composition obtained above is uniformly coated on a flat plate such as a glass plate or a stainless steel plate or on a base film such as polyester film (or sheet). This coating method is not particularly limited and for example, a doctor blade, a knife coater, or a die coater may be used. After the aforementioned coating process, varnish is heated and dried and then cooled at room temperature and when the resin film is separated from the flat plate or base film, a single layer of film-shaped adhesive is obtained.

Another method is such that into film-shaped (or sheet-shaped) breathable cloth such as glass cloth, carbon fiber cloth, or polyamide cloth, varnish of adhesive composition obtained above is immersed and it is heated and dried.

The film-shaped adhesive may be a film-shaped adhesive of a plurality of layers (the base is also counted as a layer) that the aforementioned film-shaped adhesive is applied on both sides of the film-shaped base. As a film-shaped base, there are a heat resistant film of engineering plastics such as polyimide, polyamide, polysulfone, polyphenylene sulfide, polyether ketone, or polyarylate and metal foil such as copper foil, aluminum foil, or stainless steel foil.

Furthermore, films or porous films of polyimide, epoxy resin, polyethylene terephthalate, cellulose, acetate, polytetrafluoroethylele may be used.

The aforementioned heat resistant film is preferably a film having Tg higher than the glass transition temperature (Tg) of adhesive resin and generally a film of a glass transition temperature of 200° C. or more, preferably 250° C. or more is used. The heat resistant film is more preferably a film having a water absorption rate of 2 wt % or less and a thermal expansion coefficient of $3 \times 10^{-5}$/° C. or less. The heat resistant film meeting such characteristics is, for example, a polyimide film.

The heat resistant film, in order to increase the adhesion with adhesive resin, is preferably subjected to the chemical treatment such as the alkali treatment or silane coupling treatment, the physical treatment such as sand blast, the plasma treatment, or the corona treatment.

According to the present invention, a film-shaped adhesive of a plurality of layers is manufactured as shown below. Firstly, varnish of adhesive composition mentioned above is uniformly coated on the base of the aforementioned heat resistant film. As a coating method, for example, there are means using a doctor blade, a knife coater, or a die coater available. The base of a heat resistant film or metal foil may be immersed in a varnish solution of adhesive composition mentioned above. After the coating process, a film-shaped adhesive of a plurality of layers is obtained after heating and drying. The heating and drying conditions are the same as the conditions of the aforementioned single layer film-shaped adhesive.

When both sides of the base are to be coated with heat resistant adhesive varnish, the heat resistant adhesives to be coated on both sides may be the same or different.

Another manufacturing method of a film-shaped adhesive of a plurality of layers will be explained hereunder. Firstly, in the same way as with the manufacturing method of a single layer film-shaped adhesive, varnish of adhesive composition mentioned above is uniformly coated on a base film such as a polyester film (or sheet). The coating method in this case is the same as the aforementioned. After the coating process, the heat resistant base film is heated and dried and then adhered so that the adhesive surface comes in contact. The adhering method is sufficient if the adhesive surface is closely adhered to the base film surface free of generation of voids and for example, a laminator may be used. Furthermore, on both sides of the base film, film-shaped adhesive may be adhered. The conditions of adhering temperature, pressure, and speed may be decided as required according to the physical properties such as the glass transition temperature and softening point of adhesive composition.

According to the present invention, with respect to the conductor, a conductor is directly formed on a semiconductor element protection layer, or a stress cushioning layer, or a through hole by deposition or plating and then formed by etching. The conductor is preferably formed by plating it with gold, copper, or aluminum and plating the uppermost surface of the conductor with gold.

The conductors for conducting the conductor and conductor between the layers are also preferably formed by plating them with gold, copper, or aluminum and plating the uppermost surfaces of the conductors with gold. Each conductor may be formed by conductive resin that conductive fine particles of carbon, graphite, gold, silver, copper, nickel, silver-plated copper, or silver-plated glass are mixed in a binder such as epoxy resin, silicone resin, or polyimide resin.

The through hole is processed by using a laser such as the He—Ne laser, Ar laser, YAG laser, or carbonic acid gas laser. As another method, a through hole may be formed in a semiconductor element protection layer or a stress cushioning layer by exposure, development, and etching using a photosensitive material.

Each external electrode is a ball-shaped one of solder alloy including tin, zinc, and lead, silver, copper, or gold or each of them coated with gold and it can electrically connect a semiconductor apparatus by contact and vibration without heat melting or heating. In addition, a terminal having a structure of an alloy of one or a combination of two or more of molybdenum, nickel, copper, platinum, and titanium or a multi-layer of two or more of them may be used.

The present invention will be explained in detail hereunder using the embodiments.

EMBODIMENTS 1 TO 7

A film-shaped adhesive composition is prepared using epoxy resin, curing agent, curing promotor, rubber, and solvent at a rate shown in each of the embodiments 1 to 7 in Table 1.

TABLE 1

|  | Embodiment 1 | Embodiment 2 | Embodiment 3 | Embodiment 4 | Embodiment 5 | Embodiment 6 | Embodiment 7 |
| --- | --- | --- | --- | --- | --- | --- | --- |
| Epoxy resin | Epicoat 1002 | Epicoat 1003 | Epicoat 1004 | Epicoat 1002 | Epicoat 1002 | Epicoat 1002 | Epicoat 1002 |
| Property at 25° C. | Solid | Solid | Solid | Solid | Solid | Solid | Solid |
| Wt % | 100 | 100 | 100 | 100 | 100 | 100 | 100 |
| Curing agent | Phenolic novolac | Phenolic novolac | Phenolic novolac | Phenolic novolac | Phenolic novolac | Phenolic novolac | Phenolic novolac |
| Wt % | 16.3 | 14.7 | 11.5 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 507 | 501 | 496 | 565 | 624 | 682 | 740 |
| Rubber | Fine particle NBR rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 125 | 150 | 175 | 200 |
| Generation of voids | None | None | None | None | None | None | None |
| Adhesive strength (kg/cm) | 1.12 | 1.10 | 1.17 | 1.16 | 1.20 | 1.18 | 1.21 |
| Moisture absorption rate (wt %) | 0.78 | 0.75 | 0.71 | 0.76 | 0.77 | 0.75 | 0.76 |
| Reflow resistance |  |  |  |  |  |  |  |
| Level 1 | 0 | 0 | 0 | 0 | 0 | 0 | 0 |
| Level 3 | 0 | 0 | 0 | 0 | 0 | 0 | 0 |
| Humidity resistance | 0 | 0 | 0 | 0 | 0 | 0 | 0 |
| Temperature cycle property | 0 | 0 | 0 | 0 | 0 | 0 | 0 |

In the table, Epicoat 1002, Epicoat 1003, and Epicoat 1004 (all manufactured by Yuka Shell Co., Ltd.) are an epoxy resin which is solid at 25° C. and XER-91 (by JSR Co., Ltd.) is fine particles of crosslinking acrylonitride-butadiene rubber having a carboxyl group in its molecular structure.

Next, the film-shaped adhesive composition prepared above is coated on a polyethylene terephthalate film with a thickness of 20 μm uniformly in a thickness of 200 μm using a knife coater and dried at 150° C. for 10 minutes and a film-shaped adhesive with a thickness of 100 μm is obtained on the polyethylene terephthalate film.

The prepared film-shaped adhesive is adhered onto a silicon wafer on which semiconductor elements are formed at 180° C. under the condition of a linear pressure of 4 kgf/cm and a speed of 2 cm/s using a laminator and the polyethylene terephthalate film is torn off and post-cured at 180° C. for 60 minutes. Here, it is observed whether voids are generated at the time of adhesion. The number of samples is 10 films for each. Furthermore, the adhesive strength between the silicon wafer on which semiconductor elements are formed and the film-shaped adhesive is evaluated by the peel strength of peeling off the film-shaped adhesive perpendicularly from the silicon wafer. The results are also shown in Table 1.

Thereafter, using the YAG laser (by ESI Co., Ltd., wave length 350 nm, peak output 4 kW, energy 200 μJ, pulse width 50 ns) on the electrode pad on the semiconductor element, a through hole with a hole diameter of 50 μm is formed.

Furthermore, a thin film of copper with a thickness of 0.5 μm is formed on the film-shaped adhesive and inside the through hole by vacuum vapor deposition and further a copper film is formed in a thickness of 10 μm by electroplating.

Thereafter, a photosensitive resist (P-RS300S, by Tokyo Oka Co., Ltd.) is coated on the plated film and it is baked at 90° C. for 30 minutes, and the pattern is exposed and developed, and an etching mask is formed. Next, copper is etched in a ferric chloride water solution (ferric chloride concentration: 40 Baume, specific gravity: about 1.38) at 40° C., and the resist is peeled off, and a conductor is formed.

Next, a photosensitive solder resist agent (PSR4000 manufactured by Taiyo Ink Co., Ltd.) is spin-coated on the conductor and stress cushioning layer, mutually exposed and developed at 80° C. for 20 minutes so as to form a land, and additionally cured at 150° C. for 60 minutes.

A flux is coated on the prepared land, and crystalline solder balls (Pb 63:Sn 37) with a diameter of 0.6 mm are put on it, and an external electrode is formed by infrared reflow heating at 240° C. for 5 seconds.

Thereafter, in order to obtain a minimum unit for the semiconductor apparatus to operate, a dicing layer with a thickness of 200 μm is attached to a dicer (DAD520, manufactured by disco Co., Ltd.), and the silicon wafer on which semiconductor elements are formed, film-shaped adhesive, and solder resist are separated on the same surface, and the semiconductor element shown in FIG. 1 is obtained.

The obtained semiconductor apparatus is evaluated in the reflow resistance on the basis of Level 1 and Level 2 of the reflow resistance evaluation method of JEDEC. Concretely, in the Level 2 evaluation, the semiconductor apparatus is subjected to moisture absorption for 168 hours in a constant temperature and humidity bath at 85° C. and 60% RH and subjected to the reflow treatment three times in an infrared reflow furnace at a maximum temperature of 245° C. and generation of defects such as peeling-off and voids due to a foaming phenomenon in the semiconductor apparatus is observed with a microscope. In the Level 1 evaluation, the semiconductor apparatus is subjected to moisture absorption for 168 hours in the constant temperature and humidity bath at 85° C. and 85% RH and in the same way as with Level 2, subjected to the reflow treatment three times in the infrared reflow furnace at a maximum temperature of 245° C. and generation of defects such as peeling-off and voids due to a foaming phenomenon in the semiconductor apparatus is observed with a microscope. 30 semiconductor apparatuses are subjected to the reflow test respectively. The number of semiconductor apparatuses in which peeling-off and voids are generated is shown in Table 1 as a reflow resistance fault.

Furthermore, the obtained semiconductor apparatuses are subjected to the pressure cooker test PCT (at 121° C. and 100% RH, 2 atm) for 400 hours and the electric continuity of the wiring substrate and solder balls is measured. 30 semiconductor apparatuses are subjected to the pressure cooker test respectively. The number of samples which are found not to be conducted as a result of measurement is shown in Table 1 as a humidity resistance fault.

Furthermore, the obtained semiconductor apparatuses are connected and mounted to the mounting substrate via solder balls and subjected to the temperature cycle test. The test condition of at −55° C. for 10 minutes, at 150° C. for 10 minutes, and at −55° C. for 10 minutes is repeated 1000 times and the electric continuity of the wiring substrate and solder balls is measured. 30 semiconductor apparatuses are subjected to the temperature cycle test respectively. The number of samples which are found not to be conducted as a result of measurement is shown in Table 1 as a temperature cycle fault.

COMPARATIVE EXAMPLES 1 TO 6

A film-shaped adhesive composition is prepared using epoxy resin, curing agent, curing promotor, rubber, and solvent at a rate shown in each of the comparison examples 1 to 6 in Table 2.

TABLE 2

|  | Comparison example 1 | Comparison example 2 | Comparison example 3 | Comparison example 4 | Comparison example 5 | Comparison example 6 |
| --- | --- | --- | --- | --- | --- | --- |
| Epoxy resin | Epicoat 828 | Epicoat 834 | Epicoat 1002 | Epicoat 1002 | Epicoat 1002 | Epicoat 1002 |
| Property at 25° C. | Liquid | Semisolid | Solid | Solid | Solid | Solid |
| Wt % | 100 | 100 | 100 | 100 | 100 | 100 |
| Curing agent | Phenolic novolac | Phenolic novolac | Phenolic novolac | Phenolic novolac | Phenolic novolac | Phenolic novolac |
| Wt % | 56.1 | 42.4 | 16.3 | 16.3 | 16.3 | 16.3 |

TABLE 2-continued

|  | Comparison example 1 | Comparison example 2 | Comparison example 3 | Comparison example 4 | Comparison example 5 | Comparison example 6 |
|---|---|---|---|---|---|---|
| Curing promotor | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 600 | 568 | 507 | 507 | 460 | 787 |
| Rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 100 | 80 | 220 |
| Generation of voids | None | None | None | None | None |  |
| Adhesive strength (kg/cm) | 0.60 | 0.68 | 1.34 | 0.11 | 1.02 | 1.30 |
| Moisture absorption rate (wt %) | 1.38 | 1.13 | 1.15 | 0.70 | 0.81 | 0.75 |
| Reflow resistance |  |  |  |  |  |  |
| Level 1 | 30 | 30 | 30 | 30 | 10 | 5 |
| Level 3 | 10 | 5 | 26 | 30 | 0 | 0 |
| Humidity resistance | 25 | 20 | 30 | 30 | 0 | 0 |
| Temperature cycle property | 5 | 3 | 25 | 30 | 30 | 0 |

In the table, Epicoat 828 and Epicoat 834 (all manufactured by Yuka Shell Co., Ltd.) are an epoxy resin which is liquid or solid at 25° C., and #5001 (by Teikoku Kagaku Co., Ltd.) is polymeric acrylic rubber which is soluble by a solvent, and E-500 (by Toray Dowconing Co., Ltd.) is silicon fine particles. Furthermore, using the prepared film-shaped adhesive composition, by the same method as that of Embodiments 1 to 7, a film-shaped adhesive is prepared and the semiconductor apparatus shown in FIG. 1 is prepared. Furthermore, in the same way as with the aforementioned, the adhesive strength and existence of generation of voids are evaluated. The results are shown in Table 2.

For the obtained semiconductor apparatuses, in the same way as with Embodiments 1 to 7, the reflow resistance, humidity resistance, and temperature cycle property are evaluated. The obtained results are shown in Table 2.

As shown in Embodiments 1 to 3 in Table 1 and Comparison examples 1 and 2 in Table 2, when the semiconductor apparatus (Embodiments 1 to 3) using a film-shaped adhesive prepared using an epoxy resin which is solid at 25° C. as a stress cushioning layer of the semiconductor apparatus shown in FIG. 1 is compared with the semiconductor apparatus (Comparison examples 1 and 2) using a film-shaped adhesive prepared using epoxy resin which is liquid or semisolid at 25° C. as a stress cushioning layer of the semiconductor apparatus shown in FIG. 1, it is a semiconductor apparatus which is outstanding in the reflow resistance, humidity resistance, and temperature cycle property.

Furthermore, as shown in Embodiment 1 in Table 1 and Comparison example 3 in Table 2, when the semiconductor apparatus (Embodiment 1) using a film-shaped adhesive prepared using fine particles of crosslinking acrylonitride-butadiene rubber having a carboxyl group in its molecular structure as a stress cushioning layer of the semiconductor apparatus shown in FIG. 1 is compared with the semiconductor apparatus (Comparison example 3) using a film-shaped adhesive prepared using polymeric acrylic rubber as a stress cushioning layer of the semiconductor apparatus shown in FIG. 1, it is a semiconductor apparatus which is outstanding in the reflow resistance, humidity resistance, and temperature cycle property.

Furthermore, as shown in Embodiment 1 in Table 1 and Comparison example 4 in Table 2, when the semiconductor apparatus (Embodiment 1) using a film-shaped adhesive prepared using fine particles of crosslinking acrylonitride-butadiene rubber having a carboxyl group in its molecular structure as a stress cushioning layer of the semiconductor apparatus shown in FIG. 1 is compared with the semiconductor apparatus (Comparison example 4) using a film-shaped adhesive prepared using silicon rubber fine particles as a stress cushioning layer of the semiconductor apparatus shown in FIG. 1, it is a semiconductor apparatus which is outstanding in the reflow resistance, humidity resistance, and temperature cycle property.

Furthermore, as shown in Embodiment 1 and Embodiments 4 to 7 in Table 1 and Comparison examples 5 and 6 in Table 2, when the semiconductor apparatus using a film-shaped adhesive prepared using 100 to 200 wt % of fine particles of crosslinking acrylonitride-butadiene rubber having a carboxyl group in its molecular structure to 100 wt % of epoxy resin as a stress cushioning layer of the semiconductor apparatus shown in FIG. 1 is compared with a case of less than 100 wt % (Comparison example 5), it is outstanding in the reflow resistance and temperature cycle property and when it is compared with a case of more than 200 wt % (Comparison example 6), it is outstanding in the reflow resistance.

From the aforementioned, according to the present invention, when a film-shaped adhesive prepared using 100 to 200 wt % of fine particles of crosslinking acrylonitride-butadiene rubber having an epoxy resin composition which is solid at 25° C. and a carboxyl group in its molecular structure to 100 wt % of epoxy resin is used as a stress cushioning layer of a semiconductor apparatus, a semiconductor apparatus which is outstanding in the reflow resistance, humidity resistance, and temperature cycle property can be provided.

EMBODIMENTS 8 TO 14

Using epoxy resin, curing agent, curing promotor, rubber, and solvent at a rate shown in each of Embodiments 8 to 14 in Table 3, in the same way as with Embodiments 1 to 7, a film-shaped adhesive with a thickness of 100 $\mu$m is obtained on a polyethylene terephthalate film.

TABLE 3

|  | Embodiment 8 | Embodiment 9 | Embodiment 10 | Embodiment 11 | Embodiment 12 | Embodiment 13 | Embodiment 14 |
|---|---|---|---|---|---|---|---|
| Epoxy resin | Epicoat 1002 | Epicoat 1003 | Epicoat 1004 | Epicoat 1002 | Epicoat 1002 | Epicoat 1002 | Epicoat 1002 |
| Property at 25° C. | Solid | Solid | Solid | Solid | Solid | Solid | Solid |
| Wt % | 100 | 100 | 100 | 100 | 100 | 100 | 100 |
| Curing agent | Phenolic novolac | Phenolic novolac | Phenolic novolac | Phenolic novolac | Phenolic novolac | Phenolic novolac | Phenolic novolac |
| Wt % | 16.3 | 14.7 | 11.5 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 507 | 501 | 496 | 565 | 624 | 682 | 740 |
| Rubber | Fine particle NBR rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 125 | 150 | 175 | 200 |
| Generation of voids | None | None | None | None | None | None | None |
| Adhesive strength (kg/cm) | 1.10 | 1.12 | 1.20 | 1.12 | 1.21 | 1.18 | 1.20 |
| Moisture absorption rate (wt %) | 1.10 | 1.08 | 1.05 | 1.08 | 1.09 | 1.10 | 1.09 |
| Reflow resistance |  |  |  |  |  |  |  |
| Level 1 | 0 | 0 | 0 | 0 | 0 | 0 | 0 |
| Level 3 | 0 | 0 | 0 | 0 | 0 | 0 | 0 |
| Humidity resistance | 0 | 0 | 0 | 0 | 0 | 0 | 0 |
| Temperature cycle property | 0 | 0 | 0 | 0 | 0 | 0 | 0 |

On a silicone wafer on which semiconductor elements are formed, photosensitive polyimide (by Hitachi Kasei Co., Ltd., HD-6000) is spin-coated and then exposed and developed, and a through hole with a diameter of 50 µm is formed on the electrode pad on the semiconductor element, and the polyimide is baked at 350° C. for 30 minutes, and a polyimide protection film with a thickness of 5 µm is formed.

Furthermore, a thin film of copper with a thickness of 0.5 µm is formed on the film-shaped adhesive and inside the through hole by vacuum vapor deposition and further a copper film is formed in a thickness of 10 µm by electroplating.

Thereafter, a photosensitive resist (P-RS300S, by Tokyo Oka Co., Ltd.) is coated on the plated film and it is baked at 90° C. for 30 minutes, and the pattern is exposed and developed, and an etching mask is formed. Next, copper is etched in a ferric chloride water solution (ferric chloride concentration: 40 Baume, specific gravity: about 1.38) at 40° C., and the resist is peeled off, and a conductor is formed.

The prepared film-shaped adhesive is adhered onto the polyimide protection film at 180° C. under the condition of a linear pressure of 4 kgf/cm and a speed of 2 cm/s using a laminator and the polyethylene terephthalate film is torn off and post-cured at 180° C. for 60 minutes. Here, it is observed whether voids are generated at the time of adhesion. The number of samples is 10 films for each. Furthermore, the adhesive strength between the silicon wafer on which semiconductor elements are formed and the film-shaped adhesive is evaluated by the peel strength of peeling off the film-shaped adhesive perpendicularly from the silicon wafer. The results are also shown in Table 3.

Figure 2:
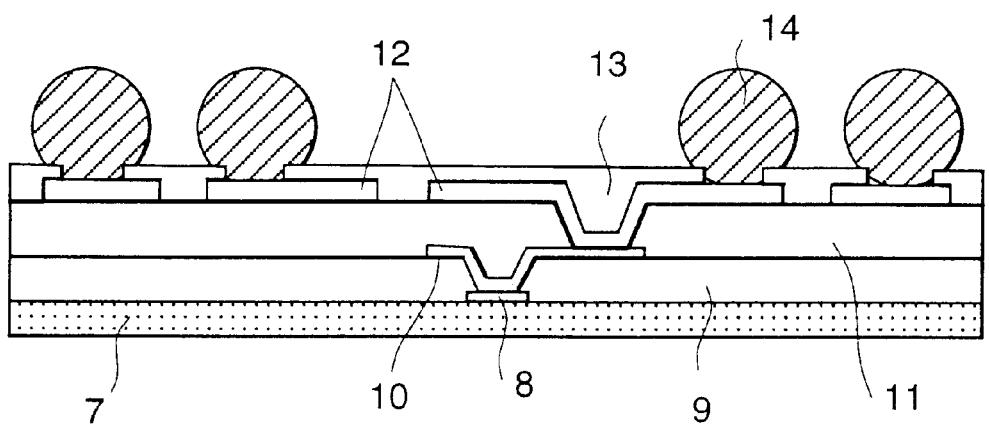
FIG. 2 is a cross sectional schematic view showing an example of a semiconductor apparatus of the present invention.

Thereafter, on the land of the conductor formed on the polyimide, in the same way as with Embodiments 1 to 7, a through hole is formed using the YAG laser, and a copper film, a conductor, and a land are formed, and flux coating, infrared reflow heating, external electrode forming, and separation by the dicer are carried out, and the semiconductor element shown in FIG. 2 is obtained.

For the obtained semiconductor apparatuses, in the same way as with Embodiments 1 to 7, the reflow resistance, pressure cooker test PCT, and temperature cycle test are evaluated. The results are shown in Table 3.

COMPARATIVE EXAMPLES 7 TO 12

Using epoxy resin, curing agent, curing promotor, rubber, and solvent at a rate shown in each of Comparison examples 7 to 12 in Table 4, in the same way as with Embodiments 1 to 7, a film-shaped adhesive is prepared and in the same way as with Embodiments 8 to 14, the semiconductor apparatus shown in FIG. 2 is prepared. Furthermore, in the same way, the adhesive strength and existence of generation of voids are evaluated. The results are shown in Table 2.

For the obtained semiconductor apparatuses, in the same way as with Embodiments 1 to 7, the reflow resistance, humidity resistance, and temperature cycle property are evaluated. The obtained results are shown in Table 4.

TABLE 4

|  | Comparison example 7 | Comparison example 8 | Comparison example 9 | Comparison example 10 | Comparison example 11 | Comparison example 12 |
|---|---|---|---|---|---|---|
| Epoxy resin | Epicoat 828 | Epicoat 834 | Epicoat 1002 | Epicoat 1002 | Epicoat 1002 | Epicoat 1002 |
| Property at 25° C. | Liquid | Semisolid | Solid | Solid | Solid | Solid |
| Wt % | 100 | 100 | 100 | 100 | 100 | 100 |
| Curing agent | Phenolic novolac | Phenolic novolac | Phenolic novolac | Phenolic novolac | Phenolic novolac | Phenolic novolac |
| Wt % | 56.1 | 42.4 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 600 | 568 | 507 | 507 | 460 | 787 |
| Rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 100 | 80 | 220 |
| Generation of voids | None | None | None | None | None |  |
| Adhesive strength (kg/cm) | 0.62 | 0.75 | 1.35 | 0.10 | 1.03 | 1.25 |
| Moisture absorption rate (wt %) | 1.54 | 1.36 | 1.37 | 1.04 | 1.12 | 1.08 |
| Reflow resistance |  |  |  |  |  |  |
| Level 1 | 30 | 30 | 30 | 30 | 9 | 4 |
| Level 3 | 11 | 5 | 25 | 30 | 0 | 0 |
| Humidity resistance | 25 | 19 | 30 | 30 | 0 | 0 |
| Temperature cycle property | 6 | 3 | 23 | 30 | 30 | 0 |

As shown in Embodiments 8 to 10 in Table 3 and Comparison examples 7 and 8 in Table 4, when the semiconductor apparatus (Embodiments 8 to 10) using a film-shaped adhesive prepared using an epoxy resin which is solid at 25° C. as a stress cushioning layer of the semiconductor apparatus shown in FIG. 2 is compared with the semiconductor apparatus (Comparison examples 7 and 8) using a film-shaped adhesive prepared using an epoxy resin which is liquid or semisolid at 25° C. as a stress cushioning layer of the semiconductor apparatus shown in FIG. 2, it is a semiconductor apparatus which is outstanding in the reflow resistance, humidity resistance, and temperature cycle property.

Furthermore, as shown in Embodiment 8 in Table 3 and Comparison example 9 in Table 4, when the semiconductor apparatus (Embodiment 8) using a film-shaped adhesive prepared using fine particles of crosslinking acrylonitride-butadiene rubber having a carboxyl group in its molecular structure as a stress cushioning layer of the semiconductor apparatus shown in FIG. 2 is compared with the semiconductor apparatus (Comparison example 9) using a film-shaped adhesive prepared using polymeric acrylic rubber as a stress cushioning layer of the semiconductor apparatus shown in FIG. 2, it is a semiconductor apparatus which is outstanding in the reflow resistance, humidity resistance, and temperature cycle property.

Furthermore, as shown in Embodiment 8 in Table 3 and Comparison example 10 in Table 4, when the semiconductor apparatus (Embodiment 8) using a film-shaped adhesive prepared using fine particles of crosslinking acrylonitride-butadiene rubber having a carboxyl group in its molecular structure as a stress cushioning layer of the semiconductor apparatus shown in FIG. 2 is compared with the semiconductor apparatus (Comparison example 10) using a film-shaped adhesive prepared using silicon rubber fine particles as a stress cushioning layer of the semiconductor apparatus shown in FIG. 2, it is a semiconductor apparatus which is outstanding in the reflow resistance, humidity resistance, and temperature cycle property.

Furthermore, as shown in Embodiment 3 and Embodiments 11 to 14 in Table 3 and Comparison examples 11 and 12 in Table 4, when the semiconductor apparatus using a film-shaped adhesive prepared using 100 to 200 wt % of fine particles of crosslinking acrylonitride-butadiene rubber having a carboxyl group in its molecular structure to 100 wt % of epoxy resin as a stress cushioning layer of the semiconductor apparatus shown in FIG. 2 is compared with a case of less than 100 wt % (Comparison example 11), it is outstanding in the reflow resistance and temperature cycle property and when it is compared with a case of more than 200 wt % (Comparison example 12), it is outstanding in the reflow resistance.

As mentioned above, when the film-shaped adhesive of the present invention is used as a stress cushioning layer of the semiconductor apparatus shown in FIG. 2, a semiconductor apparatus which is outstanding in the reflow resistance, humidity resistance, and temperature cycle property can be obtained.

EMBODIMENTS 15 TO 21

Using epoxy resin, curing agent, curing promotor, rubber, and solvent at a rate shown in each of Embodiments 15 to 21 in Table 5, in the same way as with Embodiments 1 to 7, a film-shaped adhesive with a thickness of 100 μm is obtained on a polyethylene terephthalate film.

TABLE 5

|  | Embodment 15 | Embodment 16 | Embodment 17 | Embodment 18 | Embodment 19 | Embodment 20 | Embodment 21 |
|---|---|---|---|---|---|---|---|
| Epoxy resin | Epicoat 1002 | Epicoat 1003 | Epicoat 1004 | Epicoat 1002 | Epicoat 1002 | Epicoat 1002 | Epicoat 1002 |
| Property at 25° C. | Solid | Solid | Solid | Solid | Solid | Solid | Solid |
| Wt % | 100 | 100 | 100 | 100 | 100 | 100 | 100 |
| Curing agent | Phenolic novolac | Phenolic novolac | Phenolic novolac | Phenolic novolac | Phenolic novolac | Phenolic novolac | Phenolic novolac |
| Wt % | 16.3 | 14.7 | 11.5 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 507 | 501 | 496 | 565 | 624 | 682 | 740 |
| Rubber | Fine particle NBR rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 125 | 150 | 175 | 200 |
| Generation of voids | None | None | None | None | None | None | None |
| Adhesive strength (kg/cm) | 1.12 | 1.10 | 1.17 | 1.16 | 1.20 | 1.18 | 1.21 |
| Moisture absorption rate (wt %) | 0.78 | 0.75 | 0.71 | 0.78 | 0.77 | 0.75 | 0.76 |
| Reflow resistance |  |  |  |  |  |  |  |
| Level 1 | 0 | 0 | 0 | 0 | 0 | 0 | 0 |
| Level 3 | 0 | 0 | 0 | 0 | 0 | 0 | 0 |
| Humidity resistance | 0 | 0 | 0 | 0 | 0 | 0 | 0 |
| Temperature cycle property | 0 | 0 | 0 | 0 | 0 | 0 | 0 |

The prepared film-shaped adhesive is adhered onto a silicon wafer on which semiconductor elements are formed at 180° C. under the condition of a linear pressure of 4 kgf/cm and a speed of 2 cm/s using a laminator and the polyethylene terephthalate film is torn off and post-cured at 180° C. for 60 minutes. Here, it is observed whether voids are generated at the time of adhesion. The number of samples is 10 films for each. Furthermore, the adhesive strength between the silicon wafer on which semiconductor elements are formed and the film-shaped adhesive is evaluated by the peel strength of peeling off the film-shaped adhesive perpendicularly from the silicon wafer. The results are also shown in Table 5.

Thereafter, in the same way as with Embodiments 1 to 7, a same through hole as that of Embodiments 1 to 7 is formed using the YAG laser and a scribe line is formed on both sides respectively at a distance of 400 μm from the center of the separation line by the dicer.

Thereafter, in the same way as with Embodiments 1 to 7, a copper film is formed and a conductor is formed.

Next, a photosensitive solder resist agent (PSR4000 manufactured by Taiyo Ink Co., Ltd.) is spin-coated on the conductor and stress cushioning layer, mutually exposed and developed at 80° C. for 20 minutes so as to form a land and a scribe line on both sides respectively at a distance of 200 μm from the center of the separation line by the dicer, and additionally cured at 150° C. for 60 minutes.

Figure 3:
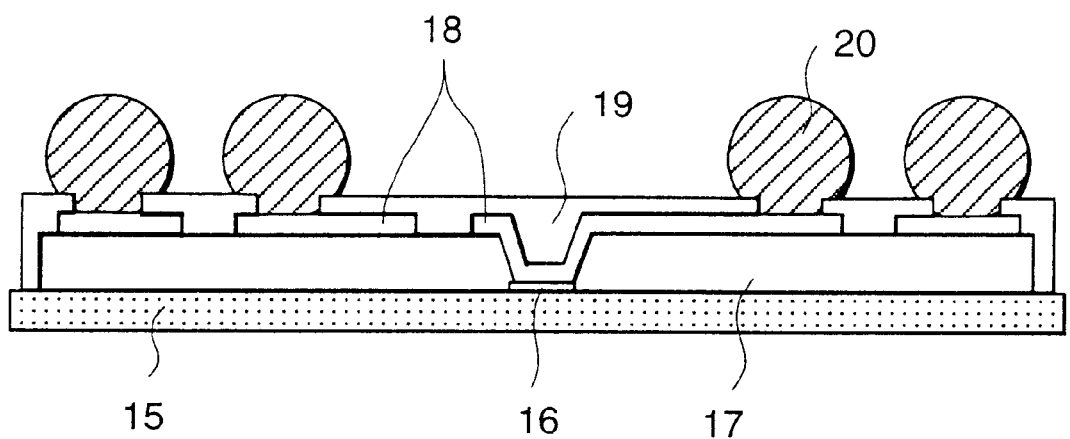
FIG. 3 is a cross sectional schematic view showing an example of a semiconductor apparatus of the present invention.

Thereafter, flux coating, infrared reflow heating, external electrode forming, and separation by the dicer are carried out and the semiconductor element shown in FIG. 3 is obtained.

For the obtained semiconductor apparatuses, in the same way as with Embodiments 1 to 7, the reflow resistance, pressure cooker test PCT, and temperature cycle test are evaluated. The results are shown in Table 5.

COMPARISON EXAMPLES 13 TO 18

Using epoxy resin, curing agent, curing promotor, rubber, and solvent at a rate shown in each of Comparison examples 13 to 18 in Table 6, in the same way as with Embodiments 1 to 7, a film-shaped adhesive is prepared and in the same way as with Embodiments 15 to 21, the semiconductor apparatus shown in FIG. 3 is prepared. Furthermore, in the same way, the adhesive strength and existence of generation of voids are evaluated. The results are shown in Table 3.

For the obtained semiconductor apparatuses, in the same way as with Embodiments 1 to 7, the reflow resistance, humidity resistance, and temperature cycle property are evaluated. The obtained results are shown in Table 6.

TABLE 6

|  | Comparison example 13 | Comparison example 14 | Comparison example 15 | Comparison example 16 | Comparison example 17 | Comparison example 18 |
|---|---|---|---|---|---|---|
| Epoxy resin | Epicoat 828 | Epicoat 834 | Epicoat 1002 | Epicoat 1002 | Epicoat 1002 | Epicoat 1002 |
| Property at 25° C. | Liquid | Semisolid | Solid | Solid | Solid | Solid |

TABLE 6-continued

|  | Comparison example 13 | Comparison example 14 | Comparison example 15 | Comparison example 16 | Comparison example 17 | Comparison example 18 |
|---|---|---|---|---|---|---|
| Wt % | 100 | 100 | 100 | 100 | 100 | 100 |
| Curing agent | Phenolic novolac | Phenolic novolac | Phenolic novolac | Phenolic novolac | Phenolic novolac | Phenolic novolac |
| Wt % | 56.1 | 42.4 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 600 | 568 | 507 | 507 | 460 | 787 |
| Rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 100 | 80 | 220 |
| Generation of voids | None | None | None | None | None | Existence |
| Adhesive strength (kg/cm) | 0.60 | 0.68 | 1.34 | 0.11 | 1.02 | 1.30 |
| Moisture absorption rate (wt %) | 1.38 | 1.13 | 1.15 | 0.70 | 0.81 | 0.75 |
| Reflow resistance |  |  |  |  |  |  |
| Level 1 | 30 | 30 | 30 | 30 | 9 | 4 |
| Level 3 | 11 | 7 | 24 | 30 | 0 | 0 |
| Humidity resistance | 26 | 20 | 30 | 30 | 0 | 0 |
| Temperature cycle property | 3 | 2 | 24 | 30 | 30 | 0 |

As shown in Embodiments 15 to 17 in Table 5 and Comparison examples 13 and 14 in Table 6, when the semiconductor apparatus (Embodiments 15 to 17) using a film-shaped adhesive prepared using an epoxy resin which is solid at 25° C. as a stress cushioning layer of the semiconductor apparatus shown in FIG. 3 is compared with the semiconductor apparatus (Comparison examples 13 and 14) using a film-shaped adhesive prepared using an epoxy resin which is liquid or semisolid at 25° C. as a stress cushioning layer of the semiconductor apparatus shown in FIG. 3, it is a semiconductor apparatus which is outstanding in the reflow resistance, humidity resistance, and temperature cycle property.

Furthermore, as shown in Embodiment 15 in Table 5 and Comparison example 15 in Table 6, when the semiconductor apparatus (Embodiment 15) using a film-shaped adhesive prepared using fine particles of crosslinking acrylonitride-butadiene rubber having a carboxyl group in its molecular structure as a stress cushioning layer of the semiconductor apparatus shown in FIG. 3 is compared with the semiconductor apparatus (Comparison example 15) using a film-shaped adhesive prepared using polymeric acrylic rubber as a stress cushioning layer of the semiconductor apparatus shown in FIG. 3, it is a semiconductor apparatus which is outstanding in the reflow resistance, humidity resistance, and temperature cycle property.

Furthermore, as shown in Embodiment 15 in Table 5 and Comparison example 16 in Table 6, when the semiconductor apparatus (Embodiment 15) using a film-shaped adhesive prepared using fine particles of crosslinking acrylonitride-butadiene rubber having a carboxyl group in its molecular structure as a stress cushioning layer of the semiconductor apparatus shown in FIG. 3 is compared with the semiconductor apparatus (Comparison example 16) using a film-shaped adhesive prepared using silicon rubber fine particles as a stress cushioning layer of the semiconductor apparatus shown in FIG. 3, it is a semiconductor apparatus which is outstanding in the reflow resistance, humidity resistance, and temperature cycle property.

Furthermore, as shown in Embodiment 15 and Embodiments 18 to 21 in Table 5 and Comparison examples 17 and 18 in Table 6, when the semiconductor apparatus using a film-shaped adhesive prepared using 100 to 200 wt % of fine particles of crosslinking acrylonitride-butadiene rubber having a carboxyl group in its molecular structure to 100 wt % of epoxy resin as a stress cushioning layer of the semiconductor apparatus shown in FIG. 3 is compared with a case of less than 100 wt % (Comparison example 17), it is outstanding in the reflow resistance and temperature cycle property and when it is compared with a case of more than 200 wt % (Comparison example 18), it is outstanding in the reflow resistance.

As mentioned above, when the film-shaped adhesive of the present invention is used as a stress cushioning layer of the semiconductor apparatus shown in FIG. 3, a semiconductor apparatus which is outstanding in the reflow resistance, humidity resistance, and temperature cycle property can be obtained.

EMBODIMENTS 22 TO 28

Using epoxy resin, curing agent, curing promotor, rubber, and solvent at a rate shown in each of Embodiments 22 to 28 in Table 7, in the same way as with Embodiments 1 to 7, a film-shaped adhesive with a thickness of 100 μm is obtained on a polyethylene terephthalate film.

TABLE 7

|  | Embodiment 22 | Embodiment 23 | Embodiment 24 | Embodiment 25 | Embodiment 26 | Embodiment 27 | Embodiment 28 |
|---|---|---|---|---|---|---|---|
| Epoxy resin | Epicoat 1002 | Epicoat 1003 | Epicoat 1004 | Epicoat 1002 | Epicoat 1002 | Epicoat 1002 | Epicoat 1002 |
| Property at 25° C. | Solid | Solid | Solid | Solid | Solid | Solid | Solid |
| Wt % | 100 | 100 | 100 | 100 | 100 | 100 | 100 |
| Curing agent | Phenolic novolac | Phenolic novolac | Phenolic novolac | Phenolic novolac | Phenolic novolac | Phenolic novolac | Phenolic novolac |
| Wt % | 16.3 | 14.7 | 11.5 | 16.3 | 16.3 | 16.3 | 16.3 |
| Curing promotor | Triphenylphosphine | Triphenylphosphine | Triphenylphosphine | Triphenylphosphine | Triphenylphosphine | Triphenylphosphine | Triphenylphosphine |
| Wt % | 1.0 | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 507 | 501 | 496 | 565 | 624 | 682 | 740 |
| Rubber | Fine particle NBR rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 125 | 150 | 175 | 200 |
| Generation of voids | None | None | None | None | None | None | None |
| Adhesive strength (kg/cm) | 0.79 | 0.82 | 0.85 | 0.80 | 0.82 | 0.84 | 0.85 |
| Moisture absorption rate (wt %) | 0.10 | 1.08 | 1.05 | 1.05 | 1.09 | 1.10 | 1.09 |
| Reflow resistance |  |  |  |  |  |  |  |
| Level 1 | 0 | 0 | 0 | 0 | 0 | 0 | 0 |
| Level 3 | 0 | 0 | 0 | 0 | 0 | 0 | 0 |
| Humidity resistance | 0 | 0 | 0 | 0 | 0 | 0 | 0 |
| Temperature cycle property | 0 | 0 | 0 | 0 | 0 | 0 | 0 |

Next, on a silicone wafer on which semiconductor elements are formed, photosensitive polyimide (by Hitachi Kasei Co., Ltd., HD-6000) is spin-coated and then exposed and developed, and a through hole with a diameter of 50 μm is formed on the electrode pad on the semiconductor element and a scribe line is formed on both sides respectively at a distance of 600 μm from the center of the separation line by the dicer, and the polyimide is baked at 350° C. for 30 minutes, and a polyimide protection film with a thickness of 5 μm is formed.

Thereafter, in the same way as with Embodiments 8 to 14, forming of a through hole, forming of a copper film, forming of a conductor, and adhering of a film-shaped adhesive are carried out. Here, it is observed whether voids are generated at the time of adhesion. The number of samples is 10 films for each. Furthermore, the adhesive strength between the silicon wafer on which semiconductor elements are formed and the film-shaped adhesive is evaluated by the peel strength of peeling off the film-shaped adhesive perpendicularly from the silicon wafer. The results are also shown in Table 4.

Figure 4:
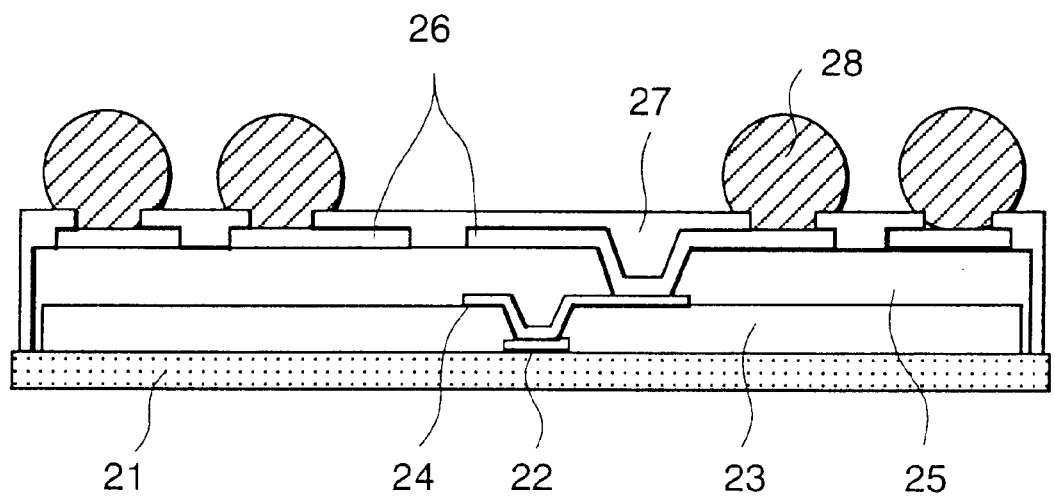
FIG. 4 is a cross sectional schematic view showing an example of a semiconductor apparatus of the present invention.

Thereafter, in the same way as with Embodiments 15 to 21, forming of a through hole and a scribe line, forming of a copper film, a conductor, and a solder resist layer, coating of flux, infrared reflow heating, forming of external electrode, and separation by the dicer are carried out, and the semiconductor element shown in FIG. 4 is obtained.

For the obtained semiconductor apparatuses, in the same way as with Embodiments 1 to 7, the reflow resistance, pressure cooker test PCT, and temperature cycle test are evaluated. The results are shown in Table 7.

COMPARISON EXAMPLES 19 TO 24

Using epoxy resin, curing agent, curing promotor, rubber, and solvent at a rate shown in each of Comparison examples 19 to 24 in Table 8, in the same way as with Embodiments 1 to 7, a film-shaped adhesive is prepared and in the same way as with Embodiments 22 to 28, the semiconductor apparatus shown in FIG. 4 is prepared. Furthermore, in the same way, the adhesive strength and existence of generation of voids are evaluated. The results are shown in Table 4.

For the obtained semiconductor apparatuses, in the same way as with Embodiments 1 to 7, the reflow resistance, humidity resistance, and temperature cycle property are evaluated. The obtained results are shown in Table 8.

TABLE 8

|  | Comparison example 19 | Comparison example 20 | Comparison example 21 | Comparison example 22 | Comparison example 23 | Comparison example 24 |
|---|---|---|---|---|---|---|
| Epoxy resin | Epicoat 828 | Epicoat 834 | Epicoat 1002 | Epicoat 1002 | Epicoat 1002 | Epicoat 1002 |
| Property at 25° C. | Liquid | Semisolid | Solid | Solid | Solid | Solid |

TABLE 8-continued

|  | Comparison example 19 | Comparison example 20 | Comparison example 21 | Comparison example 22 | Comparison example 23 | Comparison example 24 |
| --- | --- | --- | --- | --- | --- | --- |
| Wt % | 100 | 100 | 100 | 100 | 100 | 100 |
| Curing agent | Phenolic novolac | Phenolic novolac | Phenolic novolac | Phenolic novolac | Phenolic novolac | Phenolic novolac |
| Wt % | 56.1 | 42.4 | 16.3 | 16.3 | 16.3 | 16.3 |
| Curing promotor | Triphenylpho sphine | Triphenylpho sphine | Triphenylpho sphine | Triphenylpho sphine | Triphenylpho sphine | Triphenylpho sphine |
| Wt % | 1.0 | 1.0 | 1.0 | 1.0 | 1.0 | 1.0 |
| Solvent | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane | 1-acetoxy-2-ethoxyethane |
| Wt % | 600 | 568 | 507 | 507 | 460 | 787 |
| Rubber | Fine particle NBR rubber | Fine particle NBR rubber | Fine particle NBR rubber | Fine particle NBR rubber | Fine particle NBR rubber | Fine particle NBR rubber |
| Wt % | 100 | 100 | 100 | 100 | 80 | 220 |
| Generation of voids | None | None | None | None | None | Existence |
| Adhesive strength (kg/cm) | 0.62 | 0.75 | 1.35 | 0.10 | 1.03 | 1.25 |
| Moisture absorption rate (wt %) | 1.54 | 1.36 | 1.37 | 1.04 | 1.12 | 1.08 |
| Reflow resistance |  |  |  |  |  |  |
| Level 1 | 30 | 30 | 30 | 30 | 10 | 5 |
| Level 3 | 9 | 5 | 25 | 30 | 0 | 0 |
| Humidity resistance | 24 | 23 | 30 | 30 | 0 | 0 |
| Temperature cycle property | 4 | 2 | 23 | 30 | 30 | 0 |

As shown in Embodiments 22 to 24 in Table 7 and Comparison examples 19 and 20 in Table 8, when the semiconductor apparatus (Embodiments 22 to 24) using a film-shaped adhesive prepared using an epoxy resin which is solid at 25° C. as a stress cushioning layer of the semiconductor apparatus shown in FIG. 4 is compared with the semiconductor apparatus (Comparison examples 19 and 20) using a film-shaped adhesive prepared using an epoxy resin which is liquid or semisolid at 25° C. as a stress cushioning layer of the semiconductor apparatus shown in FIG. 4, it is a semiconductor apparatus which is outstanding in the reflow resistance, humidity resistance, and temperature cycle property.

Furthermore, as shown in Embodiment 22 in Table 7 and Comparison example 21 in Table 8, when the semiconductor apparatus (Embodiment 22) using a film-shaped adhesive prepared using fine particles of crosslinking acrylonitride-butadiene rubber having a carboxyl group in its molecular structure as a stress cushioning layer of the semiconductor apparatus shown in FIG. 4 is compared with the semiconductor apparatus (Comparison example 21) using a film-shaped adhesive prepared using polymeric acrylic rubber as a stress cushioning layer of the semiconductor apparatus shown in FIG. 4, it is a semiconductor apparatus which is outstanding in the reflow resistance, humidity resistance, and temperature cycle property.

Furthermore, as shown in Embodiment 22 in Table 7 and Comparison example 22 in Table 8, when the semiconductor apparatus (Embodiment 22) using a film-shaped adhesive prepared using fine particles of crosslinking acrylonitride-butadiene rubber having a carboxyl group in its molecular structure as a stress cushioning layer of the semiconductor apparatus shown in FIG. 4 is compared with the semiconductor apparatus (Comparison example 22) using a film-shaped adhesive prepared using silicon rubber fine particles as a stress cushioning layer of the semiconductor apparatus shown in FIG. 4, it is a semiconductor apparatus which is outstanding in the reflow resistance, humidity resistance, and temperature cycle property.

Furthermore, as shown in Embodiment 22 and Embodiments 25 to 28 in Table 7 and Comparison examples 23 and 24 in Table 8, when the semiconductor apparatus using a film-shaped adhesive prepared using 100 to 200 wt % of fine particles of crosslinking acrylonitride-butadiene rubber having a carboxyl group in its molecular structure to 100 wt % of epoxy resin as a stress cushioning layer of the semiconductor apparatus shown in FIG. 4 is compared with a case of less than 100 wt % (Comparison example 23), it is outstanding in the reflow resistance and temperature cycle property and when it is compared with a case of more than 200 wt % (Comparison example 24), it is outstanding in the reflow resistance.

As mentioned above, when the film-shaped adhesive of the present invention is used as a stress cushioning layer of the semiconductor apparatus shown in FIG. 4, a semiconductor apparatus which is outstanding in the reflow resistance, humidity resistance, and temperature cycle property can be obtained.

As mentioned above, when a specific resin composition is used and a film-shaped adhesive with fine particle rubber existing is also used, a semiconductor apparatus having high reliability in the reflow resistance, humidity resistance, and temperature cycle property can be obtained.

What is claimed is:

1. A semiconductor apparatus, comprising:
   a semiconductor element on which an electrode pad is formed;
   a stress cushioning layer formed on the semiconductor element, the stress cushioning layer having a through hole and being formed from a material containing an epoxy resin which is solid at 25° C. and crosslinking acrylonitrile-butadiene rubber having a carboxyl group;
   a conductor formed on the stress cushioning layer and in the through hole;
   an external electrode formed on the conductor; and
   a conductor protection layer formed on the stress cushioning layer and on the conductor except for an area on the conductor on which the external electrode exists.

2. A semiconductor apparatus according to claim 1, wherein an end face of at least one of said stress cushioning layer and said conductor protection layer extends to a surface which is inside of a surface to which an end face of the semiconductor element extends.

3. A semiconductor apparatus according to claim 1, wherein said stress cushioning layer includes a plurality of sub-layers, including sub-layers made of said material.

4. A semiconductor apparatus according to claim 1, wherein said stress cushioning layer is an adhesive layer.

5. A semiconductor apparatus according to claim 1, wherein said stress cushioning layer includes particles of said crosslinking acrylonitrile-butadiene rubber having a carboxyl group.

6. A semiconductor apparatus according to claim 1, wherein said material includes a curing agent of the epoxy resin.

7. A semiconductor apparatus according to claim 6, wherein said material further includes a curing promoter.

8. A semiconductor apparatus according to claim 1, wherein said material includes 100 to 200 wt. % of said acrylonitrile-butadiene rubber to 100 wt. % of said epoxy resin.

9. A semiconductor apparatus according to claim 8, wherein said stress cushioning layer includes particles of said crosslinking acrylonitrile-butadiene rubber having a carboxyl group.

10. A semiconductor apparatus according 9, wherein said stress cushioning layer is an adhesive layer.

11. A semiconductor apparatus according to claim 8, wherein said stress cushioning layer is an adhesive layer.

12. A semiconductor apparatus, comprising:
a semiconductor element on which an electrode pad is formed;
a stress cushioning layer formed on the semiconductor element, the stress cushioning layer having a through hole and being formed from a material containing an epoxy resin which is solid at 25° C. and crosslinking acrylonitrile-butadiene rubber having a carboxyl group;
conductor formed on the stress cushioning layer and in the through hole;
an external electrode formed on the conductor; and
a conductor protection layer formed on the stress cushioning layer and on the conductor, except for an area on the conductor on which the external electrode exists,
wherein end faces of (a) said semiconductor element and of (b) at least one of said stress cushioning layer and said conductor protection layer are located on a same surface.

13. A semiconductor apparatus according to claim 12, wherein said material includes 100 to 200 wt. % of said acrylonitrile-butadiene rubber to 100 wt. % of said epoxy resin.

14. A semiconductor apparatus according to claim 13, wherein said stress cushioning layer includes particles of said crosslinking acrylonitrile-butadiene rubber having a carboxyl group.

15. A semiconductor apparatus according to claim 14, wherein said stress cushioning layer is an adhesive layer.

16. A semiconductor apparatus according to claim 12, wherein said stress cushioning layer is an adhesive layer.

17. A semiconductor apparatus according to claim 12, wherein said stress cushioning layer includes particles of said crosslinking acrylonitrile-butadiene rubber having a carboxyl group.

18. A semiconductor apparatus, comprising:
a semiconductor element on which an electrode pad is formed;
a semiconductor element protection layer on said semiconductor element;
a first conductor on said semiconductor element protection layer, having a conductor for electrically connecting said electrode pad and said first conductor through a first through hole passing through the semiconductor element protection layer;
a stress cushioning layer formed on the semiconductor element protection layer and on the first conductor, the stress cushioning layer having a second through hole and being formed from a material containing an epoxy resin which is solid at 25° C. and crosslinking acrylonitrile-butadiene rubber having a carboxyl group;
a second conductor formed on the stress cushioning layer and in the second through hole;
an external electrode formed on the second conductor; and
a conductor protection layer formed on the stress cushioning layer and on the second conductor, except for an area on the second conductor on which the external electrode exists,
wherein end faces of (a) said semiconductor element and of (b) at least one of said stress cushioning layer and said conductor protection layer are located on a same surface.

19. A semiconductor apparatus according to claim 18, wherein said material includes 100 to 200 wt. % of said acrylonitrile-butadiene rubber to 100 wt. % of said epoxy resin.

20. A semiconductor apparatus according to claim 19, wherein said stress cushioning layer includes particles of said crosslinking acrylonitrile-butadiene rubber having a carboxyl group.

21. A semiconductor apparatus according to claim 20, wherein said stress cushioning layer is an adhesive layer.

22. A semiconductor apparatus according to claim 18, wherein said stress cushioning layer is an adhesive layer.

23. A semiconductor apparatus according to claim 18, wherein said stress cushioning layer includes particles of said crosslinking acrylonitrile-butadiene rubber having a carboxyl group.

24. A semiconductor apparatus, comprising:
a semiconductor element on which an electrode pad is formed;
a semiconductor element protection layer on said semiconductor element;
a first conductor on said semiconductor element protection layer, having a conductor for electrically connecting said electrode pad and said first conductor through a first through hole passing through the semiconductor element protection layer;
a stress cushioning layer formed on the semiconductor element protection layer and on the first conductor, the stress cushioning layer having a second through hole and being formed from a material containing an epoxy resin which is solid at 25° C. and crosslinking acrylonitrile-butadiene rubber having a carboxyl group;
a second conductor formed on the stress cushioning layer and in the second through hole;
an external electrode formed on the second conductor; and a conductor protection layer formed on the stress cushioning layer and on the second conductor, except for an area on the second conductor on which the external electrode exists, wherein end faces of said semiconductor element protection layer, said stress cushioning layer and said conductor protection layer are located inside of an end face of the semiconductor element.

25. A semiconductor apparatus according to claim 24, wherein said material includes 100 to 200 wt. % of said acrylonitrile-butadiene rubber to 100 wt. % of said epoxy resin.

26. A semiconductor apparatus according to claim 25, wherein said stress cushioning layer includes particles of said crosslinking acrylonitrile-butadiene rubber having a carboxyl group.

27. A semiconductor apparatus according to claim 26, wherein said stress cushioning layer is an adhesive layer.

28. A semiconductor apparatus according to claim 24, wherein said stress cushioning layer is an adhesive layer.

29. A semiconductor apparatus according to claim 24, wherein said stress cushioning layer includes particles of said crosslinking acrylonitrile-butadiene rubber having a carboxyl group.

* * * * *